United States Patent
Ha et al.

(10) Patent No.: US 11,387,845 B2
(45) Date of Patent: Jul. 12, 2022

(54) LDPC DECODER, OPERATING METHOD OF LDPC DECODER, AND SEMICONDUCTOR MEMORY SYSTEM

(71) Applicants: SK hynix Inc., Gyeonggi-do (KR); Korea Advanced Institute of Science and Technology, Daejeon (KR)

(72) Inventors: Jeong Seok Ha, Daejeon (KR); Ji Eun Oh, Daejeon (KR); Myung In Kim, Daejeon (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/033,075

(22) Filed: Sep. 25, 2020

(65) Prior Publication Data
US 2021/0250045 A1    Aug. 12, 2021

(30) Foreign Application Priority Data
Feb. 6, 2020  (KR) .................. 10-2020-0014232

(51) Int. Cl.
*H03M 13/11*   (2006.01)
*G06F 11/10*   (2006.01)

(52) U.S. Cl.
CPC ..... *H03M 13/1108* (2013.01); *G06F 11/1068* (2013.01); *H03M 13/116* (2013.01); *H03M 13/1162* (2013.01)

(58) Field of Classification Search
CPC .......... H03M 13/1108; H03M 13/116; H03M 13/1162; G06F 11/1068
USPC ....... 714/764, 763, 768, 773, 774, 752, 786, 714/799
See application file for complete search history.

(56) References Cited

U.S. PATENT DOCUMENTS

| | | | | |
|---|---|---|---|---|
| 8,601,328 | B1 * | 12/2013 | Varnica | H03M 13/3707 714/714 |
| 9,160,368 | B1 * | 10/2015 | Varnica | H03M 13/1145 |
| 9,843,414 | B2 * | 12/2017 | Winstead | H04L 1/0051 |
| 10,103,749 | B2 * | 10/2018 | Park | H03M 13/1108 |
| 11,095,316 | B2 * | 8/2021 | Ha | G06F 11/1012 |
| 2016/0241257 | A1 * | 8/2016 | Winstead | H03M 13/1108 |
| 2018/0013450 | A1 * | 1/2018 | Hsiao | H03M 13/353 |

(Continued)

OTHER PUBLICATIONS

Wadayama et al., Gradient Descent Bit Flipping Algorithms for Decoding LDPC Codes, Jun. 2010, IEEE, pp. 1610-1614. (Year: 2010).*

(Continued)

*Primary Examiner* — John J Tabone, Jr.
(74) *Attorney, Agent, or Firm* — IP & T Group LLP

(57) ABSTRACT

A method for operating a Low Density Parity Check (LDPC) decoder includes assigning each symbol of a codeword as a variable node value for each of a plurality of variable nodes, performing syndrome checking on each check node based on a parity check matrix, calculating flipping function values of the variable nodes based on syndrome values of check nodes and a flipping function, dividing the flipping function values into a plurality of groups, determining a flipping function threshold value based on a group maximum value of a group among the groups, and selectively flipping a variable node value based on a comparison result of a flipping function value of corresponding variable node and the determined flipping function threshold value.

17 Claims, 18 Drawing Sheets

(56) References Cited

U.S. PATENT DOCUMENTS

| | | | |
|---|---|---|---|
| 2018/0026658 A1* | 1/2018 | Park | H03M 13/116 |
| | | | 365/174 |
| 2018/0113760 A1 | 4/2018 | Bhatia et al. | |
| 2019/0097652 A1 | 3/2019 | Xiong et al. | |
| 2019/0158115 A1 | 5/2019 | Kuo | |
| 2020/0259511 A1* | 8/2020 | Ha | H03M 13/458 |

OTHER PUBLICATIONS

Li et al., A Modified Gradient Descent Bit Flipping Decoding Scheme for LDPC Codes, 2017, IEEE, pp. 1-6. (Year: 2017).*

Li et al., An Escaping Scheme for Gradient Descent Bit-Flipping Decoding of LDPC Codes, 2016, IEEE, pp. 2026-2030. (Year: 2016).*

Seetha et al. Adaptive Threshold Multi Bit Flipping for Low Density Parity Check Codes, 2017, IEEE, pp. 1-5. (Year: 2017).*

Vasic et al., Multi-Bit Flipping Algorithms with Probabilistic Gradient Descent, 2017, IEEE, pp. 1-7. (Year: 2017).*

Kim et al., A Study on Reducing Sorting Complexity and Memory of the Bit-Flipping Algorithm for LDPC Codes over BSC, KICS Winter Conference 2020, Feb. 2020, pp. 476-477.

* cited by examiner

- After 1 iteration
$\underline{v} = (0\ 1\ 1\ 0\ 1\ 0\ 0\ 0\ 1\ 1)$ $$H\underline{v}^t = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \begin{pmatrix} 0 \\ 1 \\ 1 \\ 0 \\ 1 \\ 0 \\ 0 \\ 0 \\ 1 \\ 1 \end{pmatrix} = \begin{pmatrix} 0 \\ 1 \\ 1 \\ 0 \\ 0 \end{pmatrix} \neq \underline{0} \quad \dashrightarrow \text{Perform next iteration}$$

Syndrome check

FIG. 10

| $E_{max}$ | $\theta^{(l)}$ | | | |
|---|---|---|---|---|
| | $l \leq 3$ | $4 \leq l \leq 5$ | $6 \leq l \leq 9$ | $10 \leq l$ |
| -1 | -3 | -1 | -1 | -1 |
| -3 | -3 | -3 | -1 | -1 |
| -5 | -3 | -3 | -1 | -5 |
| -7 | -3 | -3 | -1 | -1 |

|  | g = 1 | g = 4 | g = 8 | g = 16 | g = 32 |
|---|---|---|---|---|---|
| Avg.# of itr. | 11.36 | 11.33 | 11.33 | 11.35 | 11.34 |
| Avg.# of groups(/itr.) | 1 | 1.0779 | 1.2348 | 1.6228 | 2.4809 |
| Avg.groups needed(/cwd.) | 11.36 | 12.2277 | 14.0176 | 18.4242 | 28.3563 |
| CUs(/cwd.) | 407131 | 109548 | 62799 | 41270 | 31759 |
| ratio of reduced CUs | X | 0.73 | 0.85 | 0.90 | 0.92 | ns
LDPC DECODER, OPERATING METHOD OF LDPC DECODER, AND SEMICONDUCTOR MEMORY SYSTEM

CROSS-REFERENCE TO RELATED APPLICATIONS

The present application claims priority to Korean Patent Application No. 10-2020-0014232, filed on Feb. 6, 2020, which is incorporated herein by reference in its entirety.

BACKGROUND

1. Field

Various embodiments of the present invention relate to a Low Density Parity Check (LDPC) decoder, a method for operating the LDPC decoder, and a semiconductor memory system including the LDPC decoder.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory devices retain their stored data even when their power supplies are interrupted. Non-volatile flash memory devices are widely used as storage mediums in computer systems because of their high program speed, low power consumption, and large data storage capacity.

In non-volatile memory devices, especially in flash memory devices, the data state of each memory cell depends on the number of bits that the memory cell can program. A memory cell capable of storing 1-bit data is referred to as a single-bit cell or a single-level cell (SLC). A memory cell capable of storing multi-bit data (i.e., 2 or more bit data) is referred to as a multi-bit cell, a multi-level cell (MLC), or a multi-state cell. An MLC is advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for threshold voltage distributions is limited. Therefore, as the value k increases, the distance between the threshold voltage distributions decreases and the neighbouring threshold voltage distributions may overlap. As the neighbouring threshold voltage distributions overlap, read data may include error bits.

SUMMARY

Embodiments of the present invention are directed to an LDPC decoder capable of reading the data stored in a memory cell accurately and rapidly, a semiconductor memory system including the LDPC decoder, and a method for operating the LDPC decoder.

Embodiments of the present invention are directed to an LDPC decoder having improved error correction capability and correction speed of LDPC decoding by variably selecting a flipping function threshold value with a small alignment complexity, a semiconductor memory system including the LDPC decoder, and a method for operating the LDPC decoder.

In accordance with an embodiment of the present invention, a method for operating a Low Density Parity Check (LDPC) decoder, the method includes: assigning each symbol of a codeword as a variable node value for each of a plurality of variable nodes; performing syndrome checking on each check node based on a parity check matrix; calculating flipping function values of the variable nodes based on syndrome values of check nodes and a flipping function; dividing the flipping function values into a plurality of groups; determining a flipping function threshold value based on a group maximum value of a group among the groups; and selectively flipping a variable node value based on a comparison result of a flipping function value of corresponding variable node and the determined flipping function threshold value.

In accordance with another embodiment of the present invention, a Low Density Parity Check (LDPC) decoder includes: a syndrome checker suitable for assigning each symbol of a codeword as a variable node value for each of a plurality of variable nodes and performing syndrome checking on each check node based on a parity check matrix; a flipping function calculator suitable for calculating flipping function values of the variable nodes based on syndrome values of check nodes and a flipping function; a flipping function threshold value determiner suitable for dividing the flipping function values into a plurality of groups, and determining a flipping function threshold value based on a group maximum value of a group among the groups; and a variable node flipper suitable for selectively flipping a variable node value based on a comparison result a the flipping function value of corresponding variable node and the flipping function threshold value.

In accordance with yet another embodiment of the present invention, a semiconductor memory system includes: a semiconductor memory device; and a memory controller including a Low Density Parity Check (LDPC) decoder configured to perform error correction decoding on data read from the semiconductor memory device, wherein the LDPC decoder assigns each symbol of a codeword as a variable node value for each of a plurality of variable nodes, performs syndrome checking on each check node based on a parity check matrix, calculates flipping function values of the variable nodes based on syndrome values of check nodes and a flipping function, divides the flipping function values into a plurality of groups, and determines a flipping function threshold value based on a group maximum value of a group among the groups and a look-up table, and selectively flips a variable node value based on a comparison result of a flipping function value of corresponding variable node and the determined flipping function threshold value.

BRIEF DESCRIPTION OF THE DRAWINGS

FIG. 10 shows a look-up table in accordance with an embodiment of the present invention.

FIGS. 11 to 13 are graphs showing the results of the operation simulation of the LDPC decoder in accordance with an embodiment of the present invention.

DETAILED DESCRIPTION

Figure 1:
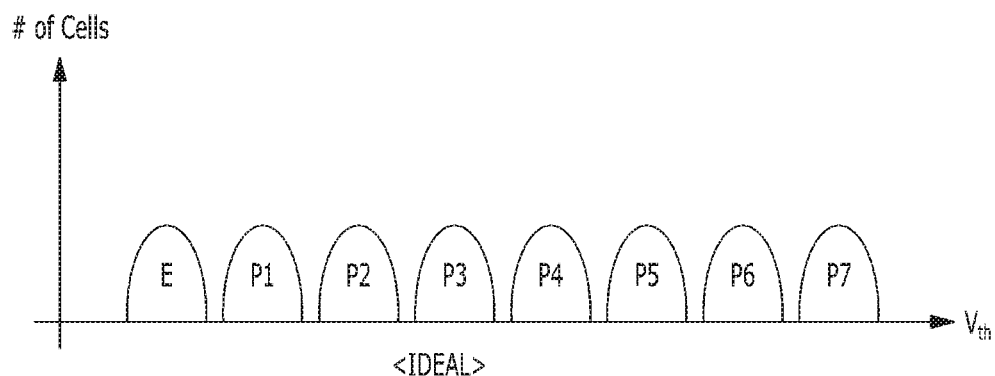
FIG. 1 is a threshold voltage distribution graph showing a program state and an erase state of a 3-bit multi-level cell (MLC) nonvolatile memory device.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or it is clear from the context to be directed to a singular form.

FIG. 1 is a threshold voltage distribution schematically illustrating program and erase states of a 3-bit MLC non-volatile memory device.

Figure 2:
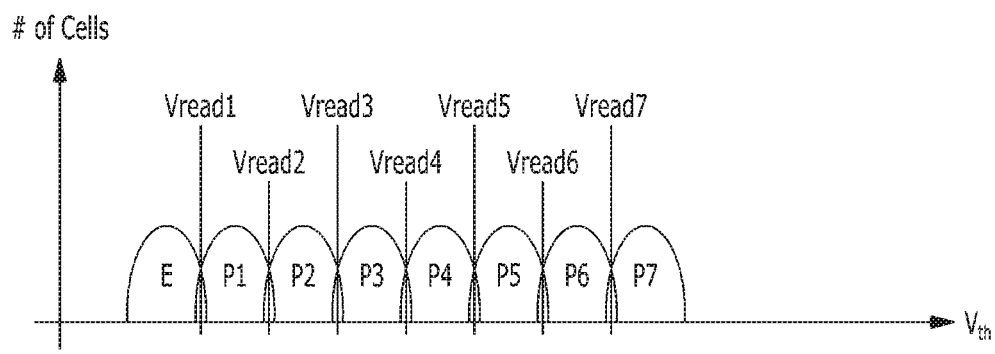
FIG. 2 is a threshold voltage distribution graph showing a program state and an erase state that may be modified due to deterioration of the characteristics of a 3-bit multi-level cell nonvolatile memory device.

FIG. 2 is a threshold voltage distribution schematically illustrating program and erase states due to characteristic deterioration of the 3-bit MLC non-volatile memory device.

In an MLC non-volatile memory device, e.g., an MLC flash memory device capable of storing k-bit data in a single memory cell, the memory cell may have one of $2^k$ threshold voltage distributions. For example, the 3-bit MLC has one of 8 threshold voltage distributions.

Threshold voltages of memory cells programmed for the same data form a threshold voltage distribution due to characteristic differences between memory cells. In the 3-bit MLC non-volatile memory device, as illustrated in FIG. 1, threshold voltage distributions are formed corresponding to the data states including 7 program states 'P1' to 'P7' and an erase state 'E'. FIG. 1 shows an ideal case in which threshold voltage distributions do not overlap and have sufficient read voltage margins therebetween. Referring to the flash memory example of FIG. 2, the memory cell may experience charge loss in which electrons trapped at a floating gate and/or tunnel oxide are discharged over time. Such charge loss may accelerate when the tunnel oxide deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency may cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is a method for precisely reading data stored in memory cells of a semiconductor memory device.

Figure 3:
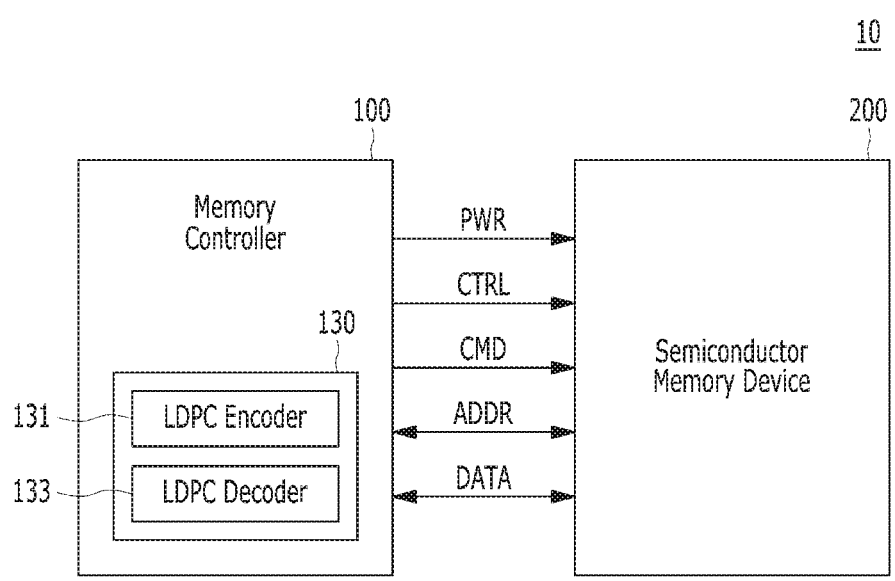
FIG. 3 is a block diagram illustrating a semiconductor memory system in accordance with an embodiment of the present invention.

FIG. 3 is a block diagram schematically illustrating a semiconductor memory system 10, in accordance with an embodiment of the present invention.

Figure 4A:
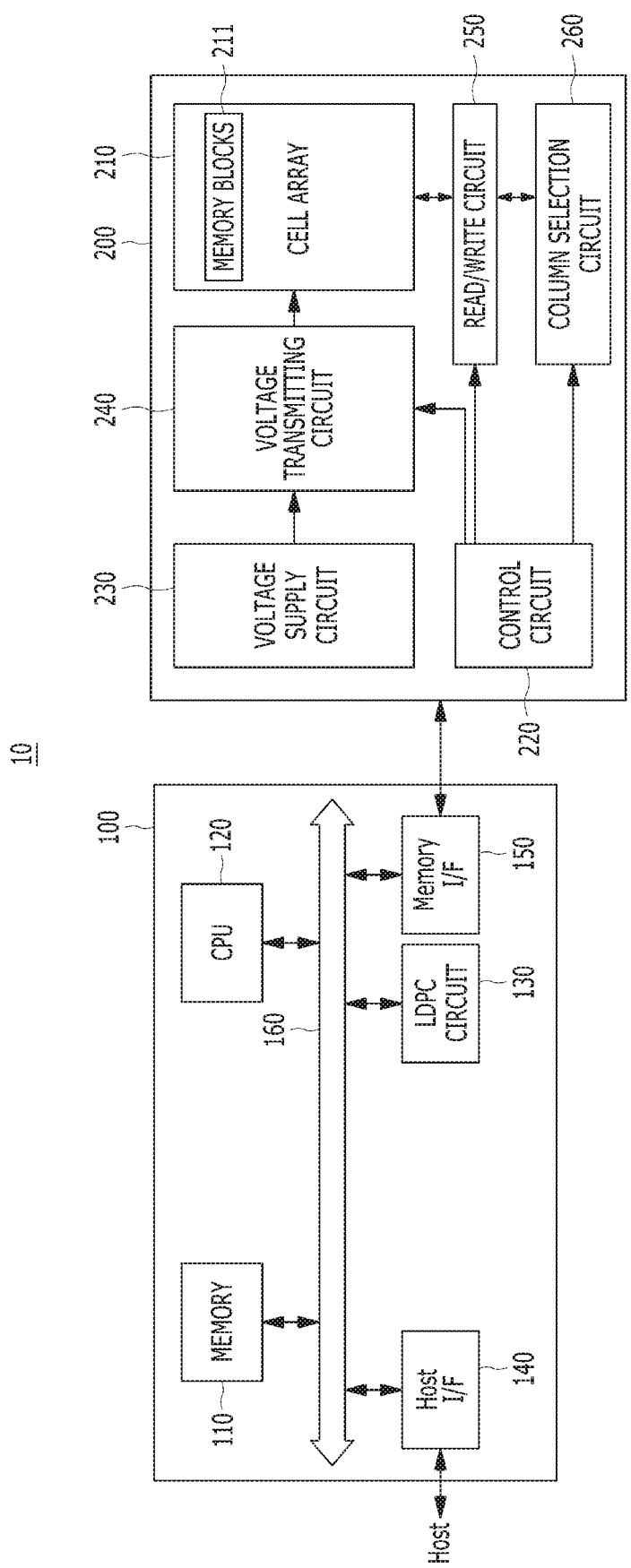
FIG. 4A is a detailed block diagram illustrating the semiconductor memory system shown in FIG. 3.
Figure 4B:
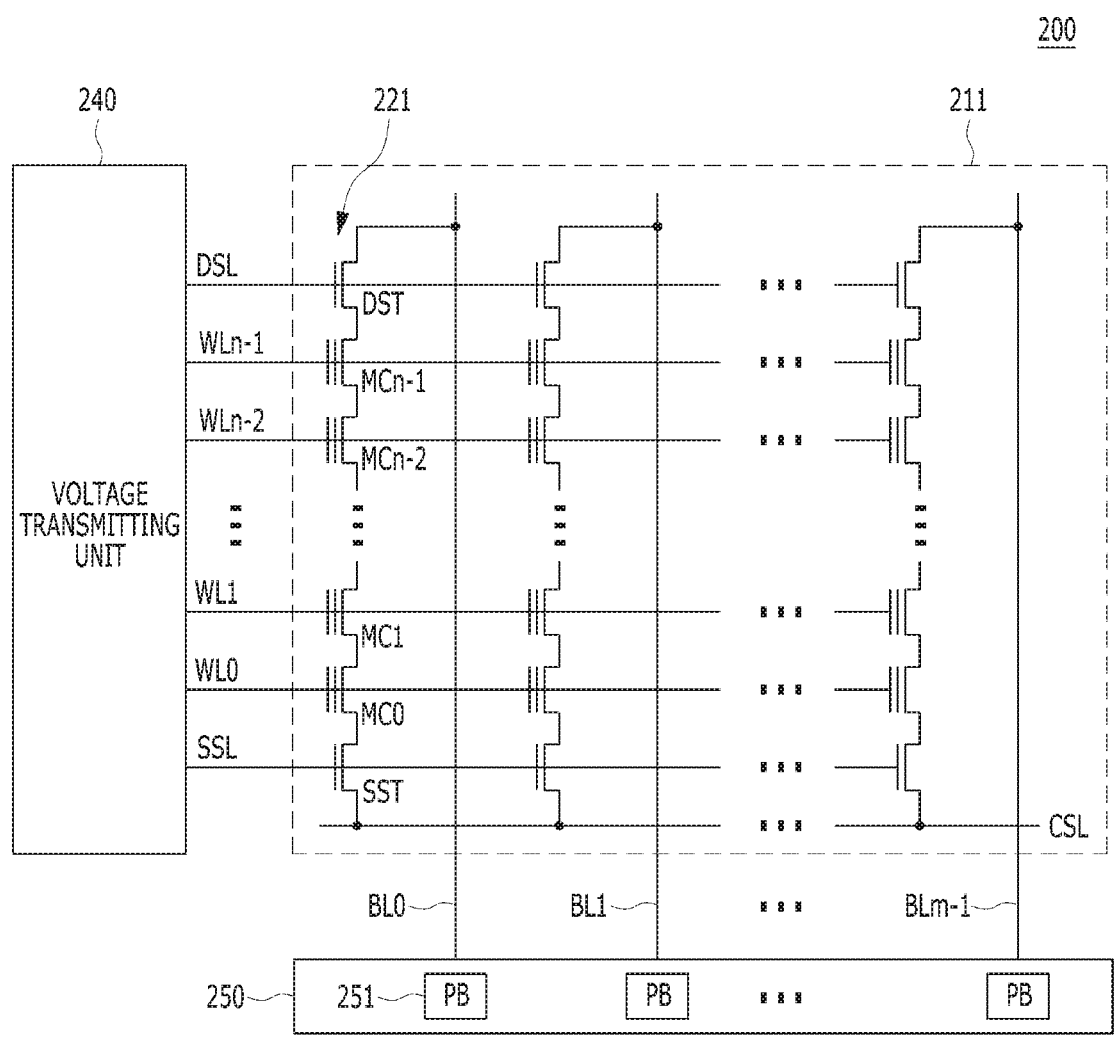
FIG. 4B is a block diagram illustrating a memory block shown in FIG. 4A.

FIG. 4A is a block diagram further illustrating in more detail the semiconductor memory system 10 of FIG. 3, and FIG. 4B is a circuit diagram illustrating a configuration of a memory block 211 employed in the semiconductor memory system of FIG. 4A.

FIG. 5 is a flowchart illustrating an operation of a memory controller 100 employed in the semiconductor memory system 10.

Referring now to FIGS. 3 to 5, a semiconductor memory system 10 is provided, according to an embodiment of the present invention. The semiconductor memory system 10 may include a semiconductor memory device 200 operatively coupled to a memory controller 100.

The semiconductor memory device 200 may perform one or more of an erase operation, a program operation, and a read operation under the control of the memory controller 100. The semiconductor memory device 200 may receive a command CMD, an address ADDR and data DATA through a plurality of input/output lines from the memory controller 100. The semiconductor memory device 200 may receive power PWR through a power line and a control signal CTRL through a control line from the memory controller 100. The control signal CTRL may include a command latch enable (CLE) signal, an address latch enable (ALE) signal, a chip enable (CE) signal, a write enable (WE) signal, a read enable (RE) signal, and the like.

The memory controller 100 may control the overall operations of the semiconductor memory device 200. The memory controller 100 may include a Low Density Parity Check (LDPC) circuit 130 for correcting error bits. The LDPC circuit 130 may include an LDPC encoder 131 and an LDPC decoder 133.

The LDPC encoder 131 may perform error correction encoding on data to be programmed into the semiconductor memory device 200 to output data to which parity bits are added. The encoded data with the parity bits may be stored in the semiconductor memory device 200.

The LDPC decoder 133 may perform error correction decoding on data read from the semiconductor memory device 200. The LDPC decoder 133 may determine whether the error correction decoding is successful, and may output an instruction signal based on the determination result. The LDPC decoder 133 may correct error bits of data using the parity bits generated by the LDPC encoding operation.

When the number of error bits exceeds the error correction capacity of the LDPC circuit 130, the LDPC circuit 130 may not correct the error bits. In this case, the LDPC circuit 130 may generate an error correction fail signal.

The LDPC circuit 130 may correct an error through a low-density parity-check (LDPC) code. The LDPC circuit 130 may include all circuits, systems, or devices for error correction. The LDPC code may be a binary LDPC code or a non-binary LDPC code.

The LDPC circuit 130 may perform an error bit correcting operation using hard decision read data and/or soft decision read data. In an embodiment, the LDPC circuit 130 may perform an error bit correcting operation using soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or a component of a computing system.

Referring to FIG. 4A, in an embodiment, the memory controller 100 may include, in addition to the LDPC circuit 130, a memory 110, a CPU 120, a host interface 140, a memory interface 150 and a system bus 160. The memory 110 may serve as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The LDPC circuit 130 may detect and correct errors included in the data read from the semiconductor memory device 200. The memory interface 150 may interface with the semiconductor memory device 200. The LDPC encoder 131 and the LDPC decoder 133 may be implemented as different and independent components even though FIG. 4A shows the LDPC circuit 130 including both of the LDPC encoder 131 and the LDPC decoder 133. The CPU 120 may perform various control operations.

In accordance with an embodiment of the present invention, during a program operation, the LDPC circuit 130 may perform an LDPC encoding operation to an original data which is to be programmed to the semiconductor memory device 200. In such case, during the read operation, the LDPC circuit 130 may perform an LDPC decoding operation to the LDPC-encoded data or a codeword, which is stored in the semiconductor memory device 200.

An original data is data received from the host before being encoded LDPC by the encoding operation of the LDPC circuit 130 during a program operation. The LDPC-encoded data are stored in the semiconductor memory device 200. The LDPC circuit 130 may then restore the original data by performing an LDPC decoding operation to the LDPC-encoded data or to the codeword stored in the semiconductor memory device 200.

The semiconductor memory device 200 may include a memory cell array 210, a control circuit 220, a voltage supply circuit 230, a voltage transmitting circuit 240, a read/write circuit 250, and a column selection circuit 260.

The memory cell array 210 may include a plurality of memory blocks 211. User data may be stored in a memory block 211. The user data may be encoded as described above.

Referring to FIG. 4B, a configuration of the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells (or memory cell transistors) MC0 to MCn−1 may be serially coupled between the selection transistors DST and SST. In an embodiment, each of the memory cells MC0 to MCn−1 may be formed of a multi-level cell (MLC) capable of storing data of multiple bits. The cell strings 221 may be electrically coupled to the corresponding bit lines BL0 to BLm−1, respectively.

FIG. 4B illustrates a memory block 211 comprising NAND-type flash memory cells. However, the memory block 211 of the semiconductor memory device 200 is not limited to being NAND flash memory. For example, the memory block 211 may comprise NOR-type flash memory cells, hybrid flash memory cells in which two or more types of memory cells are combined, and OneNAND flash memory cells. For reference, a controller is embedded inside an OneNAND flash memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control the overall operations including operations related to program, erase, and read operations of the semiconductor memory device 200.

The voltage supply circuit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply circuit 230 may generate a plurality of variable read voltages for generating a plurality of read data.

The voltage transmitting circuit 240 may select one of the memory blocks 211 or sectors of the memory cell array 210, and may select one of the word lines of the selected memory block under the control of the control circuit 220. The voltage transmitting circuit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selection circuit 260 may output the data read from the read/write circuit 250 to the outside, for example, to the memory controller 100, based on column address information. On the other hand, during a verification read operation, the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive data to be written in the memory cell array 210, and may drive the bit lines according to the input data. To this end, the read/write circuit 250 may include a plurality of page buffers (PBs) 251 corresponding to the columns (or the bit lines) or column pairs (or bit line pairs), respectively. A plurality of latches may be included in each of the page buffers 251.

Figure 5A:
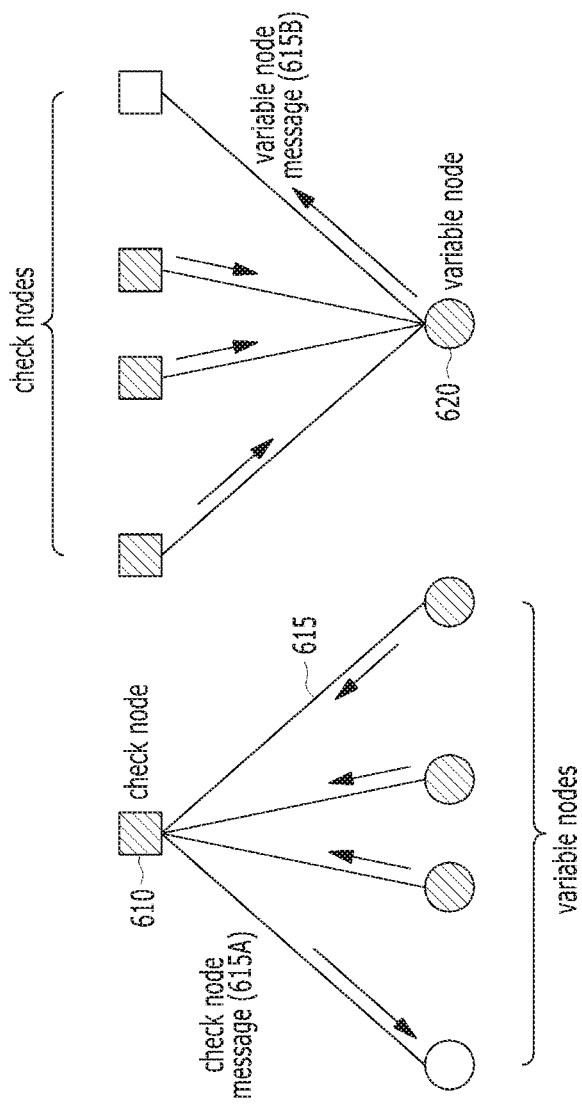
FIG. 5A is a conceptual diagram illustrating Low Density Parity Check (LDPC) decoding represented by a tenor graph.

FIG. 5A is a schematic diagram illustrating an LDPC decoding operation using a Tanner graph.

Figures 5B, 5C:
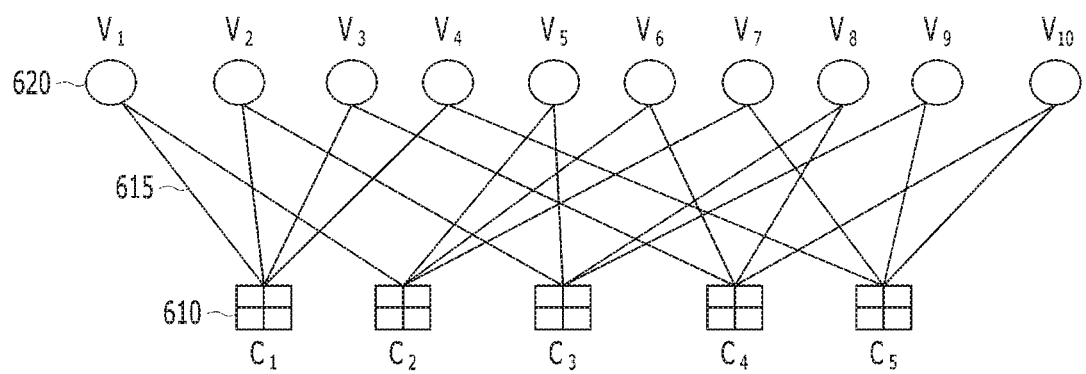
FIG. 5B is a conceptual diagram showing an LDPC code structure.
FIG. 5C is a conceptual diagram illustrating a syndrome check process according to the LDPC decoding.

FIG. 5B is a schematic diagram illustrating an LDPC code.

FIG. 5C is a schematic diagram illustrating a syndrome check process according to the LDPC decoding operation.

An error correction code (ECC) is commonly used in storage systems. Various physical phenomena occurring in storage devices result in noise effects that corrupt the stored information. Error correction coding methods can be used for protecting the stored information against the resulting errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding methods, the code is constructed as a concatenation of several simple constituent codes and is decoded based on an iterative decoding algorithm by exchanging information between decoders receiving the simple constituent codes. Usually, the code can be defined using a bipartite graph or a Tanner graph describing interconnections between the constituent codes. In this case, decoding can be viewed as an iterative message passing over the graph edges.

The iterative codes may include the low-density parity-check (LDPC) code. The LDPC code is a linear binary block code defined by a sparse parity-check matrix H. The $(d_v, d_c)$-LDPC code may be defined as a null space of a parity check matrix $H=[h_{mn}]_{M \times N}$. Herein, $d_v$ and $d_c$ may mean the components that are not 0 in each column and row in each parity check matrix, that is, the number of 1.

Referring to FIG. 5A, the LDPC code has a parity check matrix in which the number of is in each row and column is very small, and its structure can be defined by the Tanner graph including check nodes 610, variable nodes 620, and edges 615 connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

A decoding process of the LDPC code may be performed by iterative decoding based on a 'sum-product' algorithm. A decoding method can be provided based on a suboptimal message-passing algorithm such as a 'min-sum' algorithm, which is a simplified version of the sum-product algorithm.

For example, referring to FIG. 5B, the Tanner graph of the LDPC code includes 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 5B illustrates a regular LDPC code in which the number of variable nodes 620 coupled to each of the check nodes 610 is fixed at 4 and the number of the check nodes 200 coupled to each of the variable nodes 620 is fixed at 2. An initial value of the variable node 620 may be one of the hard decision read data and the soft decision read data.

FIG. 5C shows a parity check matrix H corresponding to the Tanner graph. The parity check matrix H is similar to the graphic expression of the parity check equations. The parity check matrix H has the same number of 1s in each column and each row. That is, each column of the parity check matrix H has two 1s corresponding to the connections between each of the variable nodes 620 and the check nodes 610, and each row has four 1s corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the Tanner graph. In this case, each node updates the messages based on the sum-product algorithm or a similar suboptimal algorithm.

For example, the LDPC decoding operation to the hard decision read data may comprise a plurality of iterations, each of which includes update of the check nodes 610 after an initial update of the variable nodes 620, update of the variable nodes 620, and a syndrome check. After the single iteration, when the result of the syndrome check satisfies a set condition, the LDPC decoding operation may end. When the result of the syndrome check does not satisfy the set condition, an additional iteration may be performed. The additional iteration may include the variable node update, the check node update and the syndrome check. The number of iterations may be limited to a maximum iteration count. When the result of the syndrome check does not satisfy the set condition until the number of iterations reaches the maximum iteration count, the LDPC decoding operation to the codeword may be determined to have failed in LDPC decoding operation.

Referring to FIG. 5C, the syndrome check is a process of identifying whether the product result "H$\underline{v}^t$" of the parity check matrix H and a vector "$\underline{v}$", which is obtained by the update of the variable nodes 620, satisfies the set condition.

When the product result "H$\underline{v}^t$" becomes the zero vector, the product result "H$\underline{v}^t$" may be evaluated to satisfy the set condition.

FIG. 5C shows the syndrome check process. FIG. 5C shows a non-zero vector "01100" as the product result "H$\underline{v}^t$", and thus FIG. 5C shows that the syndrome check does not satisfy the set condition and another single iteration should be performed according to another hard decision read voltage $V_{HD}$.

Considering the non-zero vector "01100" as the product result "H$\underline{v}^t$", the number of non-zero vector elements or elements, which do not meet the zero vector condition, is 2. In the description, the elements that do not meet the zero vector condition of the syndrome check for the product result "H$\underline{v}^t$" in the single iteration is defined as unsatisfied syndrome check (USC). FIG. 5C shows the result of the syndrome check where the number of the USC is 1.

An example of an LDPC decoding method of the LDPC decoder 133 may be a method using a bit flipping algorithm. The LDPC decoder 133 may perform LDPC decoding by calculating a flipping function value for each variable node when it turns out as a result of the syndrome check operation that the zero vector condition is not satisfied, and inverting a variable node whose reliability is equal to or lower than a threshold value based on the flipping function value.

According to an embodiment of the present invention, the LDPC decoder 133 may perform LDPC decoding based on a gradient descent bit flipping (GDBF) algorithm. When the GDBF algorithm is used, the flipping function value may reflect not only the syndrome value of each variable node but also the status information of a channel.

The error correction capability and error correction rate of the LDPC decoding may vary according to how the LDPC decoder 133 using the bit flipping algorithm determines a flipping function threshold value.

When a Min-flip GDBF algorithm is used that determines the minimum value of the flipping function of all variable nodes as the flipping function threshold value, the LDPC decoder 133 may correct an error accurately as long as a sufficient number of iterations is given because it inverts only the least reliable bit of the variable nodes. However, since the number of bits inverted for each iterative decoding may be small, the decoding rate may decrease. Also, in order to find the minimum value of the flipping function, the flipping function values of all variable nodes may have to be aligned. Thus, the computation amount of the LDPC decoder 133 may become excessive and the design may be complicated.

When a parallel GDBF algorithm that determines the flipping function threshold value to be 0 is used, the LDPC decoder 133 may have a fast decoding rate because it inverts all bits whose flipping function value is 0 or less, and there is no need to perform an operation for aligning the flipping function values when the threshold value of the flipping function value is determined. However, when a bit that is not erroneous is inverted more than an erroneous bit at a particular iteration, the error may be highly likely to be un-corrected, thus deteriorating the error correction capability, which is disadvantageous.

When the LDPC decoder 133 uses a Genie-aided GDBF algorithm that selects the flipping function threshold value as a value that can minimize an error rate in the next iteration, the error rate may be minimized in the next iteration. An equation for determining the threshold value in the Genie-aided GDBF algorithm is as shown in Equation 1 below.

$$\theta^{(l)} = \min_\theta P_\theta^{(l+1)}(\theta) \qquad \text{Equation 1}$$

where $\theta^{(l)}$ denotes the flipping function threshold value; and $P_e^{(l+1)}(\theta)$ denotes an error rate after determining the flipping function threshold value as $\Theta$ and flipping a bit for the number of iteration times 1.

When the LDPC decoder 133 determines the threshold value based on the Genie-aided GDBF algorithm, the error correction rate may be fast because the error rate is lowered maximally for each iteration, and the error correction capability may be excellent as well because the error rate is monotonically decreased for each iteration. However, the Genie-aided GDBF algorithm may be actually embodied based on the premise that the position of a variable node having an error is accurately known. Therefore, the Genie-aided GDBF algorithm may be used only for statistical analysis or as a control group for comparing the performance of an algorithm.

According to an embodiment of the present invention described below, the LDPC decoder 133 may variably determine a flipping function threshold value with a small amount of computation for each iteration.

The LDPC decoder 133 according to an embodiment of the present invention may divide flipping function values corresponding to variable nodes into a plurality of groups. The LDPC decoder 133 may determine a flipping function threshold value by referring to the flipping function values of some of a plurality of groups. The LDPC decoder 133 may determine a flipping function threshold value by referring to a group maximum value of any one group among the groups and a look-up table. The group maximum value may mean the maximum value among the flipping function values of a group. The look-up table may be a table showing a relationship between a group maximum value and a flipping function threshold value. According to the embodiment of the present invention, the look-up table may be created in advance by statistically analyzing a relationship between a group maximum value and a flipping function threshold value determined according to the Genie-aided GDBF algorithm.

According to an embodiment of the present invention, the LDPC decoder 133 may determine a flipping function threshold value based on a group maximum value which is determined by aligning some of the flipping function values instead of determining a flipping function threshold value by aligning all flipping function values of a flipping function vector. Accordingly, the alignment complexity of the LDPC decoder 133, that is, the amount of computation required for the LDPC decoder 133 to align the flipping function values may be reduced.

According to an embodiment of the present invention, since the LDPC decoder 133 may determine a flipping function threshold value by referring to statistical data representing the relationship between the group maximum value and the flipping function threshold value determined based on the Genie-aided GDBF algorithm, errors may be corrected at a high speed while reducing an error rate for each iteration.

Figure 6:
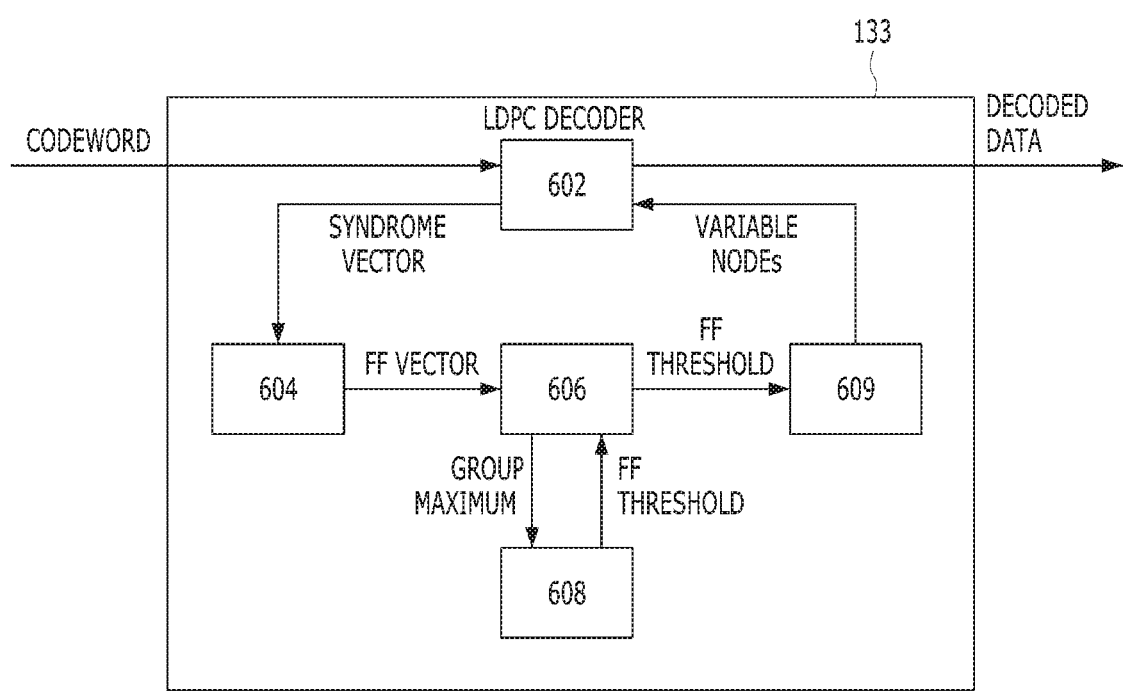
FIG. 6 is a diagram illustrating an LDPC decoder in accordance with an embodiment of the present invention.

FIG. 6 is a block diagram illustrating the LDPC decoder 133 in accordance with an embodiment of the present invention.

The LDPC decoder 133 may include a syndrome checker 602, a flipping function calculator 604, a flipping function threshold value determiner 606, a look-up table 608, and a variable node flipper 609. The constituent elements of the LDPC decoder 133 may be described in detail with reference to FIGS. 7 to 10.

Figure 7:
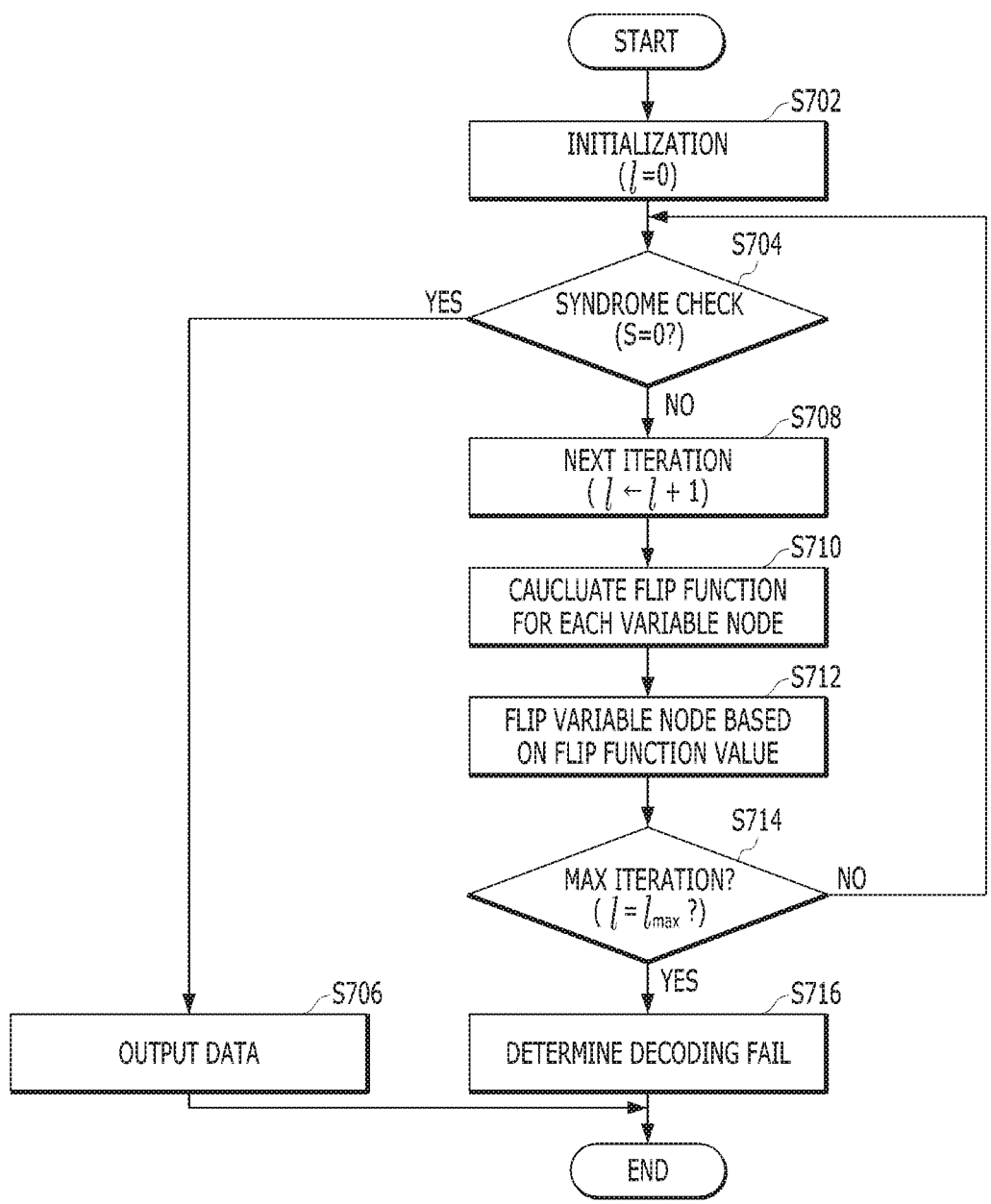
FIG. 7 is a flowchart describing an operation of an LDPC decoder performing LDPC decoding by using a flipping function decoding algorithm.

FIG. 7 is a flowchart describing an operation of the LDPC decoder 133 performing LDPC decoding based on a flipping function decoding algorithm.

In step S702, the LDPC decoder 133 may perform an initialization operation.

For example, the syndrome checker 602 may initialize the maximum number of iterations to $I_{max}$, the number of iterations of an iteration decoder to l=0, a set B of bit nodes to be flipped to an empty set, and a hard decision value z which is a decision value û of a variable node received from a channel. The initialization of the step S702 may be summarized by the following Equation 2.

$$l=0, B=\phi, \hat{u}=z \qquad \text{Equation 2}$$

In step S704, the LDPC decoder 133 may perform syndrome checking. To be specific, the syndrome checker 602 may calculate syndrome values for all check nodes based on the following Equation 3.

$$s_m = \sum_{n \in N(m)=0} \hat{u}_n H_{mn} (\text{mod} 2) \qquad \text{Equation 3}$$

Herein, $s_m$ may represent the syndrome value of the mth check node, and $H_{mn}$ may represent a non-zero component, that is, a value of 1, of an mth row and an nth column in a parity check matrix of an LDPC code. Also, N(m) may represent a set of variable nodes coupled to the mth check node, and N(m) may be defined as Equation 4 shown below.

$$N(m)=\{n|H_{mn}\neq 0, 0\leq n\leq N\}, 0\leq m\leq M \qquad \text{Equation 4}$$

As a result of the syndrome checking, when all of the syndromes are 0 ("YES" in the step S704), the LDPC decoder 133 in step S706 may stop the iteration and output a determination value $\hat{u}_n$ of an encoder.

As a result of the syndrome checking, when the syndrome vector is not a zero vector, in step S708, the LDPC decoder 133 may increase the number of iterations to l=l+1 and perform an operation of the following step S710.

In step S710, the LDPC decoder 133 may calculate flipping function values of all variable nodes.

According to an embodiment of the present invention, the flipping function calculator 604 may perform LDPC decoding based on a Gradient Descent Bit-Flipping (GDBF) algorithm. The flipping function calculator 604 may calculate a flipping function value by using the flipping function of Equation 5 below.

$$E_n = \sum_{m \in M(n)} (1-2s_m) + (1-2z_n)(1-2\hat{u}_n) \qquad \text{Equation 5}$$

Herein, $E_n$ may mean a flipping function, and M(n) may mean a set of check nodes coupled to an nth variable node. The M(n) may be defined as Equation 6 below.

$$M(n)=\{m|H_{mn}\neq 0, 0\leq m\leq M\}, 0\leq n\leq N \qquad \text{Equation 6}$$

In step S712, the LDPC decoder 133 may flip the bit value of the variable node based on the flipping function threshold value and the flipping function value of each variable node.

According to an embodiment of the present invention, the flipping function threshold value determiner 606 may divide the flipping function values calculated by the flipping function calculator 604 into a plurality of groups. The flipping function threshold value determiner 606 may determine a flipping function threshold value based on a group maximum value of any one among a plurality of groups and the look-up table 608.

The variable node flipper 609 may select a variable node whose value of the flipping function $E_n$ is equal to or less than a threshold value $\theta^{(l)}$ to define a set B as shown in Equation 7, and to flip the bit value of the variable node in the set B.

$$B=\{n|E_n \leq \theta^{(l)}\}\qquad\text{Equation 7}$$

The method of determining the flipping function threshold value will be described later in detail with reference to FIGS. 8 to 10.

In step S714, the LDPC decoder 133 may determine whether or not the number l of iterations is equal to the maximum number $I_{max}$ of iterations.

When the number l of iterations is equal to the maximum number $I_{max}$ of iterations ("YES" in step S714), in step S716, the LDPC decoder 133 may stop the iterations, determine a decoding fail, and output a decoding failure signal.

When the number l of iterations is not equal to the maximum number $I_{max}$ of iterations ("NO" in the step S714), the LDPC decoder 133 may iteratively perform the operations of the steps S704 to S714.

Figure 8:
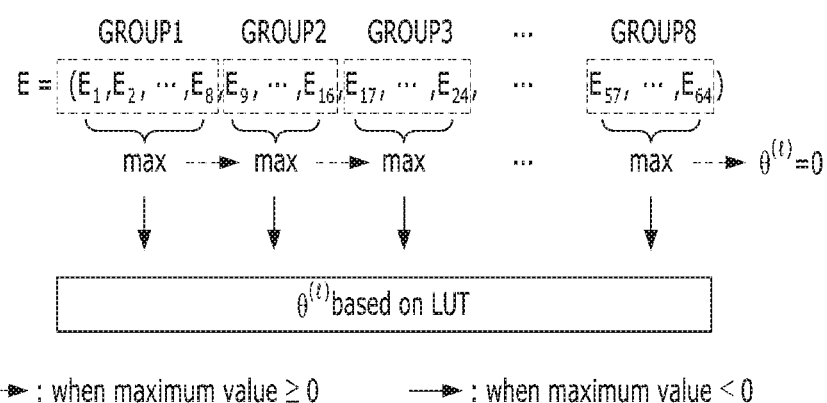
FIG. 8 illustrates an operation of the LDPC decoder in accordance with an embodiment of the present invention.

FIG. 8 illustrates an operation of the LDPC decoder 133 in accordance with an embodiment of the present invention. FIG. 8 illustrates a case where the length of a codeword is 64.

Referring to FIG. 8, E may represent a flipping function vector, and $E_1$ to $E_{64}$ may represent flipping function values included in the flipping function vector. Each of the flipping function values may be obtained through a flipping function operation for each variable node.

In the example of FIG. 8, the flipping function values included in the flipping function vector may be grouped into groups of eight. FIG. 8 illustrates a first group GROUP1 including $E_1$ to $E_8$ to an eighth group GROUP8 including $E_{57}$ to $E_{64}$.

The flipping function threshold value determiner 606 may obtain the group maximum value by aligning the flipping function values of each group until a group having a group maximum value of less than 0 is detected. When the group having the group maximum value of less than 0 is detected, the flipping function threshold value determiner 606 may determine a threshold value corresponding to the group maximum value of the group as the flipping function threshold value by referring to the look-up table (LUT) 608.

Figure 9:
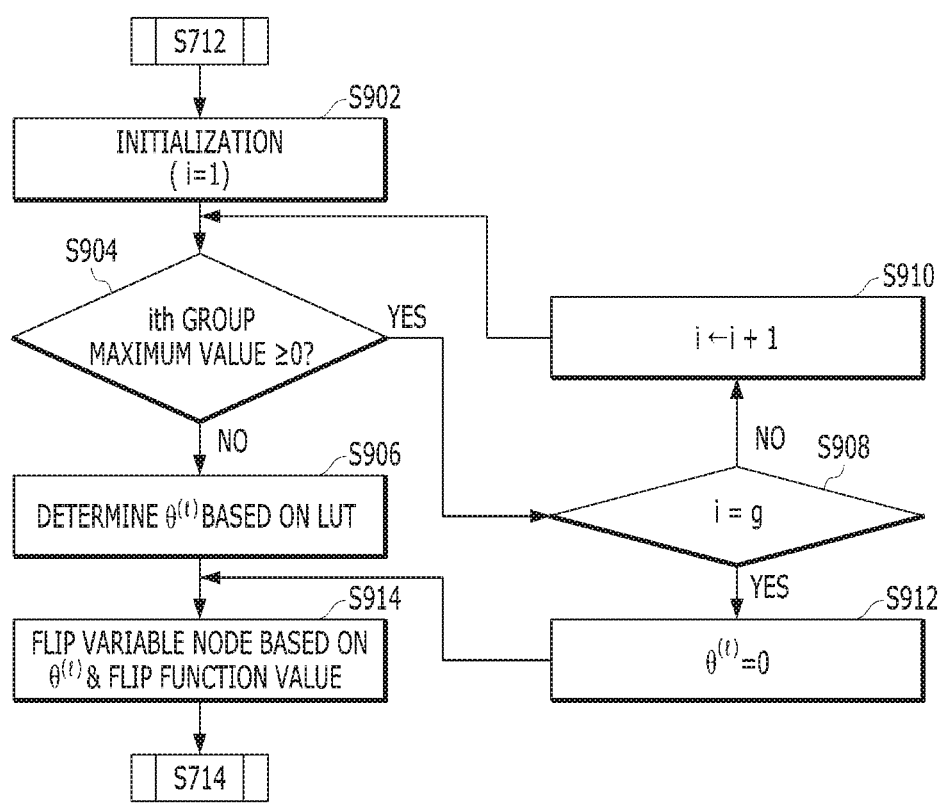
FIG. 9 is a flowchart describing an operation of an LDPC decoder in accordance with an embodiment of the present invention.

FIG. 9 is a flowchart describing an operation of the LDPC decoder 133 in accordance with an embodiment of the present invention. FIG. 9 shows detailed operations included in the step S712 that are described with reference to FIG. 7.

In step S902, the flipping function threshold value determiner 606 may perform an initialization operation. For example, the flipping function threshold value determiner 606 may divide the flipping function values of the flipping function vector $E=(E_1, E_2, \ldots, E_N)$ into g groups in order, and determine the order i of the current group to be searched is 1.

In step S904, the flipping function threshold value determiner 606 may determine whether the group maximum value of the ith group is equal to or greater than 0.

When the group maximum value of the ith group is less than 0 ("NO" in the step S904), in step S906, the flipping function threshold value determiner 606 may determine the threshold value corresponding to the group maximum value as a flipping function threshold value by referring to the look-up table 608 and perform the operation of the following step S914.

FIG. 10 shows the look-up table 608 in accordance with an embodiment of the present invention.

To be specific, FIG. 10 shows the look-up table 608 that is created by analyzing statistical data of the flipping function threshold value of the Genie-aided GDBF algorithm and the group maximum value of the flipping function in an LDPC code of which the length is 35840, variable node order is 6, and the check node order is 60.

In the look-up table 608, $E_{max}$ may represent the group maximum value, and l may represent the current number of times that iterative decoding is performed, which is simply referred to as an iterative decoding number. Also, $\theta^{(l)}$ may represent a flipping function threshold value based on the group maximum value and the iterative decoding number. For example, when the group maximum value of the first group is −5 during the 10th decoding, the flipping function threshold value determiner 606 may determine −5, which is the value corresponding to $E_{max}=-5$ and 10≤l, in the look-up table 608 as a flipping function threshold value.

Referring back to FIG. 9, when the group maximum value of the lth group is equal to or greater than 0 ("YES" in step S904), in step S908, the flipping function threshold value determiner 606 may determine whether the ith group is the last group or not.

When ith group is the last group ("YES" in the step S908), in step S912, the flipping function threshold value determiner 606 may determine the flipping function threshold value to be 0.

When the ith group is not the last group ("NO" in the step S908), in step S910, the flipping function threshold value determiner 606 may change i into i+1 and iteratively perform the operations of the steps S904 to S910.

In step S914, the flipping function threshold value determiner 606 may flip a variable node based on the flipping function threshold value and the flipping function value. To be specific, the flipping function threshold value determiner 606 may flip the corresponding variable node when the flipping function value corresponding to the variable node is smaller than the flipping function threshold value.

Figure 12:
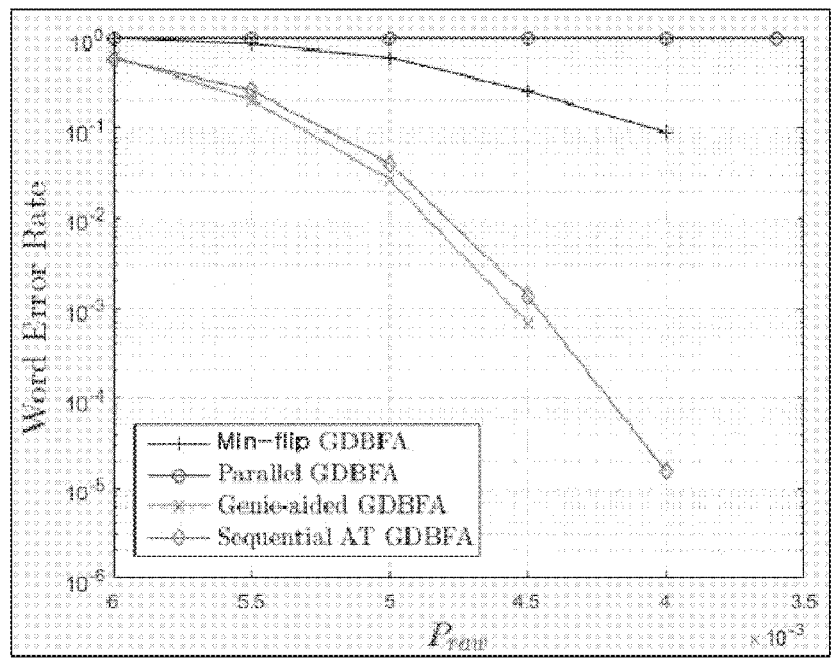
Figure 13:
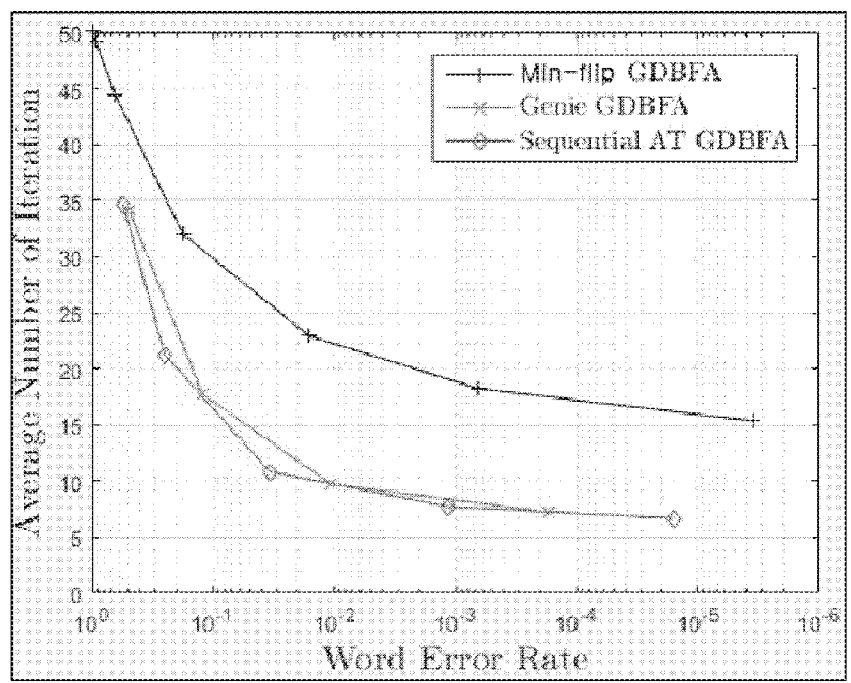

FIGS. 11 to 13 are graphs showing the results of the operation simulation of the LDPC decoder 133 in accordance with an embodiment of the present invention. All of the simulations of FIGS. 11 to 13 were performed for an LDPC code of 4 KB and Q=256, and the code rate was determined to be 0.9 when the variable node order is 6.

FIG. 11 shows average values of simulation results for an LDPC code having a length of 35840, a variable node order of 6, and a check node order of 60.

FIG. 11 presents an average number (Avg. # of itr.) of times that iterative decoding is performed that is required for success in decoding, an average number (Avg. # of groups (/itr.) of group maximum values that is required to obtain a flipping function threshold value in each iteration, an average number (Avg.groups needed(/cwd.) of group maximum values that is required to obtain the threshold value at each codeword, an alignment complexity (CUs(/cwd.)) that is required for obtaining a threshold value at each codeword, and a ratio of the alignment complexity that is reduced compared to when the group is specified as one according to the number g of groups. The alignment complexity may be represented by the number of comparison units CUs required to obtain the group maximum value.

Referring to FIG. 11, the average number of times that iterative decoding is performed, which is simply referred to as an average iterative decoding number, of LDPC decoding according to an embodiment of the present invention may be similar regardless of the number of groups.

The average number of group maximum values required to obtain the flipping function threshold value in each iteration tends to increase as the number of groups increases. For example, when g=32, the number of the cases where the group maximum value is equal to or greater than 0 is increased more than when g=4 so that the flipping function threshold value may be determined by aligning the flipping function values of groups of an average number of 2.4. However, since the number of flipping function values included in a group becomes fewer, the LDPC decoder 133 may determine the flipping function threshold value by aligning a fewer number of the flipping function values during a one-time iterative decoding as the number of groups increases until the number of groups becomes g=32.

Since the average iterative decoding number is similar irrespective of the number of groups, as the number of groups becomes larger until the number of groups becomes g=32, the LDPC decoder 133 may be able to determine the flipping function threshold value by aligning a fewer number of flipping function values until the iterative decoding is finished.

Referring to FIG. 11, the alignment complexity may decrease as the number of groups increases until the number of groups becomes g=32. Although omitted in FIG. 11, the alignment complexity may not be reduced when the number groups is larger than g=32. The number of groups in accordance with an embodiment of the present invention may be determined according to the operator's selection, but when it is determined that g=32 and the group maximum value is detected, the alignment complexity may be decreased by approximately 90%, compared to a case where the minimum value is detected by aligning the flipping function values of all variable nodes.

FIG. 12 shows a simulation result of LDPC decoding for an LDPC code having a code length of 35840, a variable node order of 6, and a check node order of 60 when the maximum number $I_{max}$ of iterations is 20. The graph of FIG. 12 may show the LDPC decoding simulation result as a word error rate according to a raw bit error rate in a channel.

FIG. 12 shows the word error rate of the LDPC decoding method according to the embodiment of the present invention and the word error rates of the existing Min-flip GDBF algorithm, Parallel GDBF algorithm, and Genie-aided GDBF algorithm. The LDPC decoding method according to the embodiment of the present invention may be represented by a Sequential Adaptive Threshold Gradient Descent Bit Flip Algorithm (Sequential AT GDBFA) in FIG. 12.

Referring to FIG. 12, it may be seen that the Sequential AT GDBF algorithm according to the embodiment of the present invention may have a word error rate close to that of the Genie-aided GDBF algorithm. When the raw bit error rate (RBER) is equal to or greater than $4.5 \times 10^{-5}$, it may be seen that the Sequential AT GDBF algorithm according to the embodiment of the present invention may be able to decrease the word error rate to one hundredth or less, compared to the existing Max-flip GDBF algorithm and the Parallel GDBF algorithm.

FIG. 13 shows a simulation result of LDPC decoding for an LDPC code having a code length of 35840, a variable node order of 6, and a check node order of 60. FIG. 13 shows the average number of decoding iterations according to the word error rate. FIG. 13 shows the average number of decoding iterations of the Sequential AT GDBF algorithm in accordance with the embodiment of the present invention, and the average number of decoding iterations of the existing Max-flip algorithm and Genie-aided GDBFA algorithm.

Referring to FIG. 13, the Sequential AT GDBF algorithm in accordance with the embodiment of the present invention may show an error correction rate close to that of the Genie-aided GDBF algorithm when the performances are the same. Also, when compared to the existing Max-flip algorithm, the average number of iterations may be reduced by approximately half.

According to an embodiment of the present invention, the LDPC decoder 133 may perform LDPC decoding by using the Sequential AT GDBF algorithm that variably determines the flipping function threshold value with less alignment complexity based on the group maximum value which is obtained by aligning only some of the flipping function values. Since the LDPC decoding according to the embodiment of the present invention has less alignment complexity, the operation amount of the LDPC decoder 133 may be reduced and thus the error correction may be performed rapidly. The LDPC decoder 133 according to the embodiment of the present invention may variably determine the flipping function threshold value based on a look-up table representing the statistical relationship between a group maximum value and a flipping function threshold value determined based on the Genie-aided GDBF algorithm. Therefore, the LDPC decoder 133 may perform error correction of data quickly and accurately with a small iterative decoding number. In this way, the LDPC decoder 133 according to the embodiment of the present invention may be able to improve the performance and reliability of the semiconductor device 10 by quickly and accurately correcting errors in the data stored in the semiconductor memory device 200.

FIGS. 14 to 19 illustrate electronic devices to which the LDPC decoder 133 according to the embodiment of the present invention described with reference to FIGS. 1 to 13 can be applied.

Figure 14:
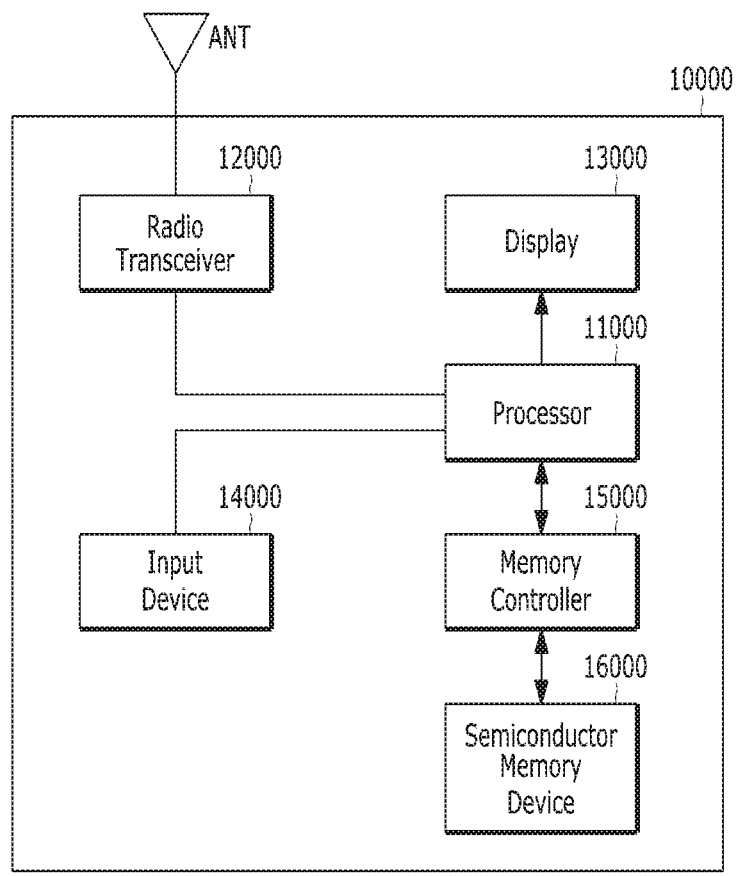
FIG. 14 is a block diagram illustrating an electronic device including a semiconductor memory system in accordance with an embodiment of the present invention.

FIG. 14 is a block diagram schematically illustrating an electronic device 10000 including a memory controller 15000 and a semiconductor memory device 16000 in accordance with an embodiment of the present invention.

Referring to FIG. 14, the electronic device 10000 may be any suitable electronic device such as a cellular phone, a smart phone, or a tablet PC including the semiconductor memory device 16000 and the memory controller 15000. The semiconductor memory device 16000 may be implemented by any suitable memory device, including, for example, a flash memory device, such as NAND or a NOR flash. The memory controller 15000 may control the semiconductor memory device 16000.

The semiconductor memory device 16000 may correspond to the semiconductor memory device 200 described above with reference to FIGS. 3 to 4B. The semiconductor memory device 16000 may store random data.

The memory controller 15000 may correspond to the memory controller 100 described with reference to FIGS. 3 to 13. The memory controller 15000 may be controlled by a processor 11000 which may control the overall operations of the electronic device 10000.

Data stored in the semiconductor memory device 16000 may be displayed through a display 13000 under the control of the memory controller 15000. The memory controller 15000 may operate under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000. The input device 14000 may be implemented, for example, by a pointing device such as a touch pad, a computer mouse, a key pad, or a keyboard.

The processor 11000 may control the display 13000 so that the data from the semiconductor memory device 16000, the radio signal from the radio transceiver 12000 or the data from the input device 14000 is displayed through the display 13000.

Figure 15:
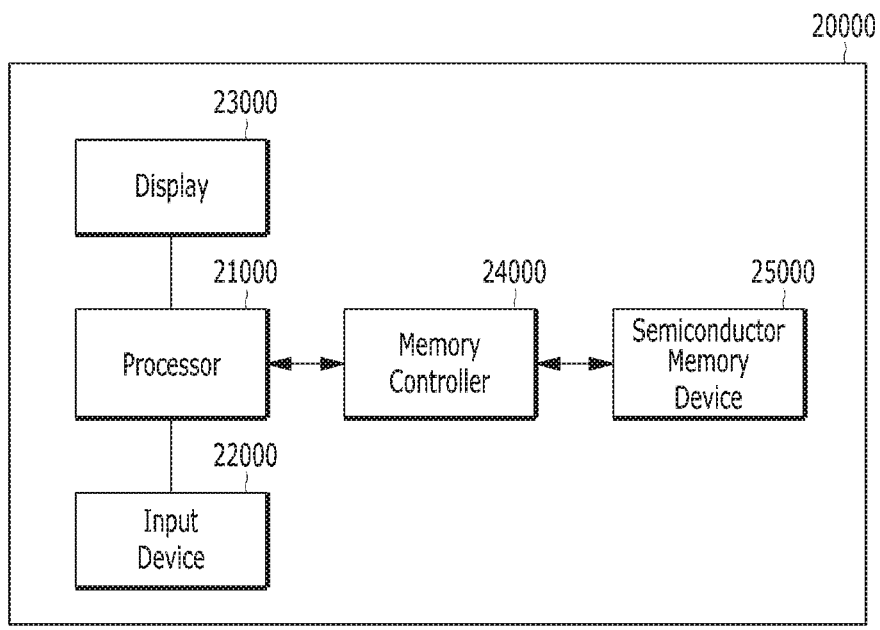
FIG. 15 is a block diagram illustrating an electronic device including a semiconductor memory system in accordance with another embodiment of the present invention.

FIG. 15 is a block diagram schematically illustrating an electronic device 20000 including a memory controller 24000 and a semiconductor memory device 25000 in accordance with another embodiment of the present invention.

The memory controller 24000 and the semiconductor memory device 25000 may correspond to the memory controller 100 and the semiconductor memory device 200 described with reference to FIGS. 3 to 13, respectively.

Referring to FIG. 15, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., a flash memory device, and the memory controller 24000 to control the operations of the semiconductor memory device 25000.

The electronic device 20000 may include a processor 21000 to control the overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented, for example, by a pointing device such as a touch pad, a computer mouse, a key pad, or a keyboard.

Figure 16:
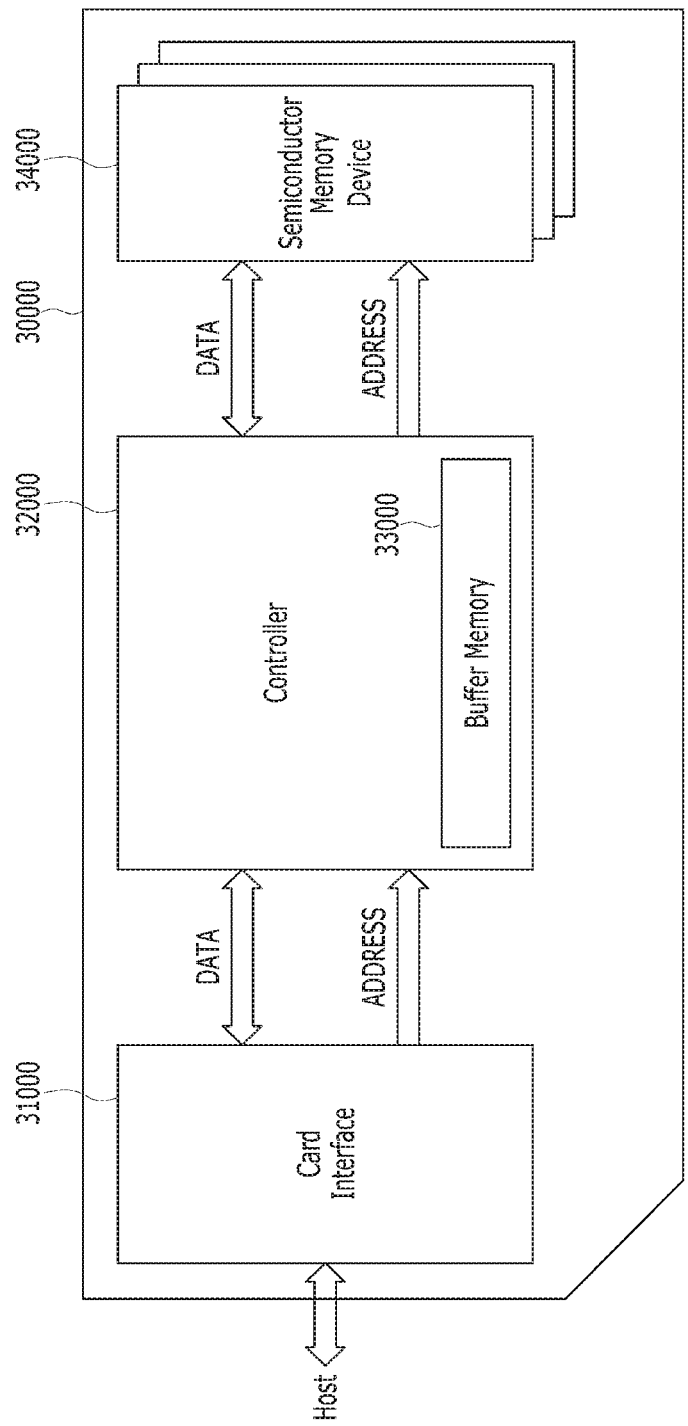
FIG. 16 is a block diagram illustrating an electronic device including a semiconductor memory system in accordance with yet another embodiment of the present invention.

FIG. 16 is a block diagram schematically illustrating an electronic device 30000 including a controller 32000 and a semiconductor memory device 34000, in accordance with yet another embodiment of the present invention.

The controller 32000 and the semiconductor memory device 34000 may correspond to the memory controller 100 and the semiconductor memory device 200 described with reference to FIGS. 3 to 13, respectively.

Referring to FIG. 16, the electronic device 30000 may include a card interface 31000, the controller 32000, and the semiconductor memory device 34000 which may be implemented, for example, with a flash memory device.

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control the overall operations of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected to the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 17:
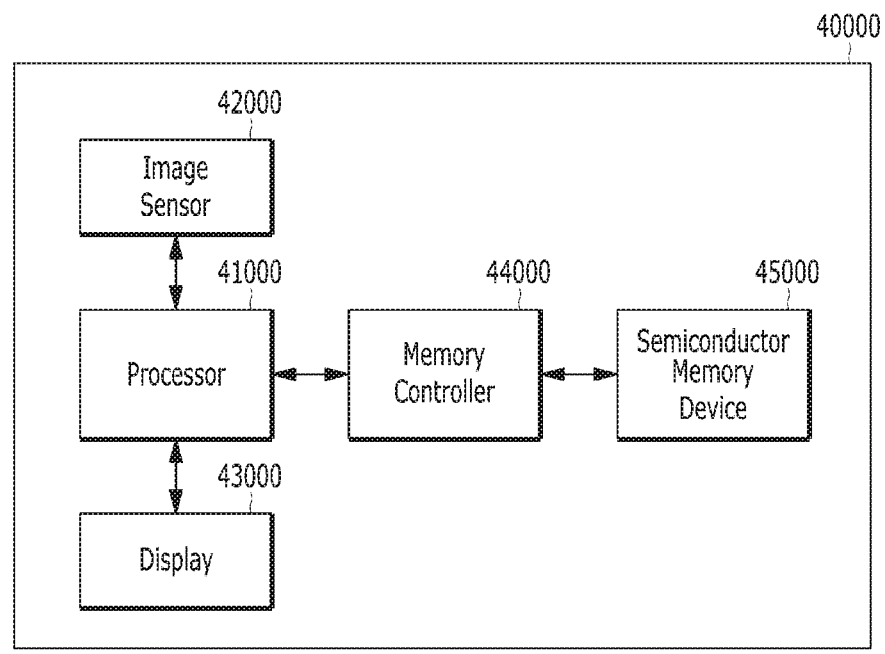
FIG. 17 is a block diagram illustrating an electronic device including a semiconductor memory system in accordance with yet another embodiment of the present invention.

FIG. 17 is a block diagram schematically illustrating an electronic device 40000 including a memory controller 44000 and a semiconductor memory device 45000 in accordance with yet another embodiment of the present invention.

The memory controller 44000 and the semiconductor memory device 45000 may correspond to the memory controller 100 and the semiconductor memory device 200 described with reference to FIGS. 3 to 13, respectively.

Referring to FIG. 17, the electronic device 40000 may include the semiconductor memory device 45000, e.g., a flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 18:
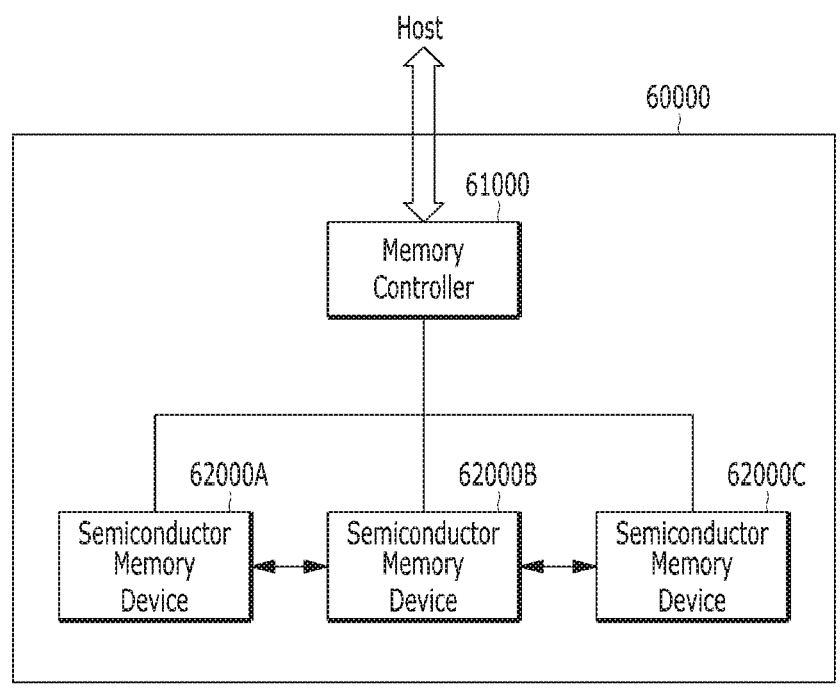
FIG. 18 is a block diagram illustrating an electronic device including a semiconductor memory system in accordance with yet another embodiment of the present invention.

FIG. 18 is a block diagram schematically illustrating an electronic device 60000 including a memory controller 61000 and semiconductor memory devices 62000A, 62000B, and 62000C, in accordance with yet another embodiment of the present invention.

The memory controller 61000 and each of the semiconductor memory devices 62000A, 62000B, and 62000C may correspond to the memory controller 100 and the semiconductor memory device 200 described with reference to FIGS. 3 to 13, respectively.

Referring to FIG. 18, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

Figure 19:
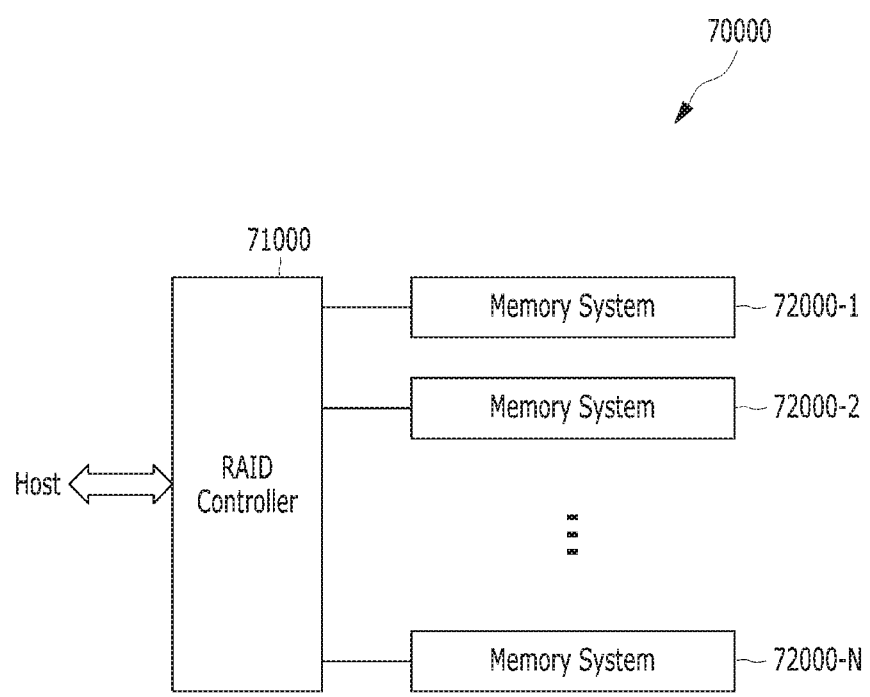
FIG. 19 is a block diagram illustrating a data processing system including the electronic device shown in FIG. 18.

FIG. 19 is a block diagram of a data processing system including the electronic device 6000 described with reference to FIG. 18.

Referring to FIGS. 18 and 19, a data storage device 70000 may be implemented by a redundant array of independent disks (RAID) system. The data storage device 70000 may include a RAID controller 71000 and a plurality of memory systems 72000_1 to 72000_N, where N is a natural number.

Each of the memory systems 72000_1 to 72000_N may correspond to the electronic device 60000 described with reference to FIG. 18. The memory systems 72000_1 to 72000_N may form a RAID array. The data storage device 70000 may be implemented by an SSD.

During a program operation, the RAID controller 71000 may output program data, which is output from a host, to one of the memory systems 72000_1 to 72000_N selected according to one of a plurality of RAID levels based on RAID level information output from the host.

During a read operation, the RAID controller 71000 may transfer data, which is read from one of the memory systems 72000_1 to 72000_N, to the host according to one of the RAID levels based on the RAID level information output from the host.

According to the embodiments of the present invention, it may be possible to read the data stored in a memory cell of a semiconductor memory device accurately and rapidly.

According to the embodiments of the present invention, error correction capability and correction speed of LDPC decoding may be improved.

While the present invention has been described with respect to the specific embodiments, it will be apparent to those skilled in the art that various changes and modifications may be made without departing from the spirit and scope of the invention as defined in the following claims.

What is claimed is:

1. A method for operating a Low Density Parity Check (LDPC) decoder, the method comprising:
   assigning each symbol of a codeword as a variable node value for each of a plurality of variable nodes;
   performing syndrome checking on each check node based on a parity check matrix;
   calculating flipping function values of the variable nodes based on syndrome values of check nodes and a flipping function;
   dividing the flipping function values into a plurality of groups;
   determining a flipping function threshold value based on a group maximum value of a group among the groups; and
   selectively flipping a variable node value based on a comparison result of a flipping function value of corresponding variable node and the determined flipping function threshold value,
   wherein the determining of the flipping function threshold value includes:
   selecting a group having a group maximum value of less than 0 by sequentially searching the plurality of groups; and
   determining a flipping function threshold value based on the group maximum value of the selected group.

2. The method of claim 1, wherein the determining of the flipping function threshold value includes:
   determining the flipping function threshold value based on a look-up table representing a relationship between the group maximum value and the flipping function threshold value.

3. The method of claim 2, wherein the look-up table includes a statistical relationship between a group maximum value and a flipping function threshold value that is determined based on a Genie-aided gradient falling bit flipping algorithm.

4. The method of claim 1, further comprising:
   iteratively performing the syndrome checking, the calculating of the flipping function values of the variable nodes, the determining of the flipping function threshold value, and the selectively flipping the variable node value, until the syndrome values of the check nodes are all 0 or the number of iterations reaches a maximum number of iterations.

5. The method of claim 4, further comprising:
   outputting, when the syndrome values of the check nodes are all 0, the variable node values as decoded data.

6. The method of claim 1, wherein a flipping function based on a gradient falling bit flipping algorithm is used as the flipping function.

7. A Low Density Parity Check (LDPC) decoder comprising:
   a syndrome checker configured to assign each symbol of a codeword as a variable node value for each of a plurality of variable nodes and perform syndrome checking on each check node based on a parity check matrix;
   a flipping function calculator configured to calculate flipping function values of the variable nodes based on syndrome values of check nodes and a flipping function;
   a flipping function threshold value determiner configured to divide the flipping function values into a plurality of groups, and determine a flipping function threshold value based on a group maximum value of a group among the groups; and
   a variable node flipper configured to selectively flip a variable node value based on a comparison result of a flipping function value of corresponding variable node and the flipping function threshold value,
   wherein the flipping function threshold value determiner is configured to:
   select a group having a group maximum value of less than 0 by sequentially searching the plurality of groups; and
   determine a flipping function threshold value based on the group maximum value of the selected group.

8. The LDPC decoder of claim 7, further comprising:
   a look-up table configured to represent a relationship between the group maximum value and the flipping function threshold value,
   wherein the flipping function threshold value determiner determines the flipping function threshold value based on the look-up table.

9. The LDPC decoder of claim 8, wherein the look-up table includes a statistical relationship between a group maximum value and a flipping function threshold value that is determined based on a Genie-aided gradient falling bit flipping algorithm.

10. The LDPC decoder of claim 7, wherein the syndrome checking, the calculation of the flipping function values, the determination of the flipping function threshold value, and the flipping of the variable node value are iteratively performed until the syndrome values of the check nodes are all 0 or the number of iterations reaches a maximum number of iterations.

11. The LDPC decoder of claim 10, wherein the syndrome checker outputs the variable node values as decoded data when the syndrome values of the check nodes are all 0.

12. The LDPC decoder of claim 7, wherein a flipping function based on a gradient falling bit flipping algorithm is used as the flipping function.

13. A semiconductor memory system comprising:
a semiconductor memory device; and
a memory controller including a Low Density Parity Check (LDPC) decoder configured to perform error correction decoding on data read from the semiconductor memory device,
wherein the LDPC decoder is configured to:
assign each symbol of a codeword as a variable node value for each of a plurality of variable nodes;
perform syndrome checking on each check node based on a parity check matrix;
calculate flipping function values of the variable nodes based on syndrome values of check nodes and a flipping function;
divide the flipping function values into a plurality of groups;
determine a flipping function threshold value based on a group maximum value of a group among the groups and a look-up table; and
selectively flip a variable node value based on a comparison result of a flipping function value of corresponding variable node and the determined flipping function threshold value,
wherein the flipping function threshold value is determined by selecting a group having a group maximum value of less than 0 by sequentially searching the groups, and determining a flipping function threshold value based on the group maximum value of the selected group.

14. The semiconductor memory system of claim 13, wherein the LDPC decoder includes the look-up table configured to represent a relationship between the group maximum value and the flipping function threshold value,
wherein the flipping function threshold value determiner determines the flipping function threshold value based on the look-up table.

15. The semiconductor memory system of claim 14, wherein the look-up table includes a statistical relationship between a group maximum value and a flipping function threshold value that is determined based on a Genie-aided gradient falling bit flipping algorithm.

16. The semiconductor memory system of claim 13, wherein the syndrome checking, the calculation of the flipping function values, the determination of the flipping function threshold value, and the flipping of the variable node value are iteratively performed until the syndrome values of the check nodes are all 0 or the number of iterations reaches a maximum number of iterations, and
wherein the syndrome checker outputs the variable node values as decoded data when the syndrome values of the check nodes are all 0.

17. The semiconductor memory system of claim 13, wherein, when calculating the flipping function values, a flipping function based on a gradient falling bit flipping algorithm is used as the flipping function.

* * * * *

UNITED STATES PATENT AND TRADEMARK OFFICE
CERTIFICATE OF CORRECTION

| | |
|---|---|
| PATENT NO. | : 11,387,845 B2 |
| APPLICATION NO. | : 17/033075 |
| DATED | : July 12, 2022 |
| INVENTOR(S) | : Jeong Seok Ha et al. |

It is certified that error appears in the above-identified patent and that said Letters Patent is hereby corrected as shown below:

On the Title Page

Item (73), insert:
-- Korea Advanced Institute of Science and Technology, Daejeon (KR) --

Signed and Sealed this
Fourteenth Day of March, 2023

Katherine Kelly Vidal
*Director of the United States Patent and Trademark Office*